US007567076B2

(12) United States Patent
Teoh et al.

(10) Patent No.: US 7,567,076 B2
(45) Date of Patent: Jul. 28, 2009

(54) AUTOMATED LOADING/UNLOADING OF DEVICES FOR BURN-IN TESTING

(75) Inventors: Wan Yen Teoh, Penang (MY); Paiboon Subpanyadee, Pakkred Nonthabruri (TH); Kurt Joseph Perez, Tracy, CA (US); Chai Soon Teo, Singapore (SG); Swee Hin Ong, Singapore (SG)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 12/055,141

(22) Filed: Mar. 25, 2008

(65) Prior Publication Data

US 2008/0169832 A1 Jul. 17, 2008

Related U.S. Application Data

(62) Division of application No. 11/424,934, filed on Jun. 19, 2006, now Pat. No. 7,378,836.

(51) Int. Cl.
*G01R 31/28* (2006.01)
*G01R 31/26* (2006.01)

(52) U.S. Cl. .................................................. 324/158.1

(58) Field of Classification Search ............. 324/158.1, 324/754–765
See application file for complete search history.

(56) References Cited

U.S. PATENT DOCUMENTS

| | | | | |
|---|---|---|---|---|
| 4,695,707 | A | 9/1987 | Young | |
| 5,184,068 | A | 2/1993 | Twigg et al. | |
| 5,191,282 | A | 3/1993 | Liken et al. | |
| 6,100,706 | A * | 8/2000 | Hamilton et al. | 324/760 |
| 6,563,331 | B1 * | 5/2003 | Maeng | 324/760 |
| 6,897,670 | B2 * | 5/2005 | Burns | 324/758 |
| 2006/0001436 | A1 * | 1/2006 | Dangelo et al. | 324/754 |
| 2006/0066293 | A1 | 3/2006 | Ballson et al. | |
| 2006/0238188 | A1 | 10/2006 | Takashi et al. | |

* cited by examiner

*Primary Examiner*—Ha Tran T Nguyen
*Assistant Examiner*—Karen M Kusumakar

(57) ABSTRACT

The automatic loading and unloading of devices for burn-in testing is facilitated by loading burn-in boards in a magazine with the stacked boards in the magazine moved into and out of a burn-in oven by means of a trolley. The trolley can include an elevator whereby a plurality of magazines can be stacked in the oven for the simultaneous burn-in testing of devices mounted on the burn-in boards. Each board has rollers on one end which are engagable by pneumatically actuated cam mechanisms for inserting the board into an electrical contact in the oven for burn-in tests. Preferably, the cam mechanisms allow for extraction of a single board for inspection.

18 Claims, 11 Drawing Sheets

70
60
20
69
84
32
78
60

AUTOMATED LOADING/UNLOADING OF DEVICES FOR BURN-IN TESTING

CROSS REFERENCE TO RELATED APPLICATIONS

This is a Divisional application of co-pending U.S. application Ser. No. 11/424,934 entitled "Automated Loading/Unloading of Devices for Burn-In Testing", by Teoh et al., filed Jun. 19, 2006, which claims the benefit of U.S. Provisional Patent Application No. 60/766,316, entitled "Automated Loading/Unloading of Devices for Burn-In Testing", filed Jan. 10, 2006, which are incorporated herein by reference.

BACKGROUND OF THE INVENTION

This invention relates generally to the fabrication of semiconductor devices, and more particularly the invention relates to the loading and unloading of cycler boards into an oven for burn-in testing.

Literally millions of semiconductor devices are fabricated each year. A final step in the fabrication is a burn-in test of each packaged device to identify defective devices.

In carrying out the burn-in tests, a plurality of multi-layer printed circuit boards or "burn-in" boards are provided with each board having a plurality of test sockets for receiving packaged devices for testing. One end of each board has contacts for mating with connectors of the test apparatus to facilitate the testing of each device. One such test apparatus is the AEHR Corporation MTX oven which receives a plurality of stacked boards for burn-in testing of devices in a heated environment.

Heretofore, packaged devices had been loaded automatically into a burn-in board at a Loader/Unloader Station with a human operator sequentially providing the burn-in boards for device insertion into the test sockets. After a full stack of burn-in boards have been loaded with packaged devices, the human operator physically and sequentially moves each board to the AEHR burn-in oven for testing. The process is time consuming and the placement of the loaded burn-in boards can be physically taxing. Other burn-in systems employ a magazine for holding a plurality of burn-in boards which can be loaded into an oven in one operation. However, known systems employ a board latching mechanism at the back of the oven for engaging board contacts with oven connectors. The mechanism is manually actuated, and the location at the back of the oven complicates routine maintenance of the mechanism.

The present invention is directed to alleviating these difficulties found in prior art burn-in systems.

SUMMARY OF THE INVENTION

In accordance with the invention, a magazine or carrier is provided for a plurality of stacked burn-in boards, and a trolley is employed to move the magazine from the Loader/Unloader Station to the burn-in oven for testing and for returning tested devices on the burn-in boards back to Loader/Unloader Station.

In one embodiment, the magazine has a plurality of rails for slidably receiving the burn-in boards with the top of the magazine being open to allow the insertion and removal of devices in the board sockets at the Loader/Unloader Station. The magazine has a bottom support surface which can move over rollers in the Loader/Unloader Station and in the oven to facilitate movement into and out of the Loader/Unloader Station and the oven.

The trolley or cart is provided for moving a loaded magazine between the Loader/Unloader Station and the oven. The trolley has wheels to facilitate the movement, and a support surface of the trolley has rollers for receiving the bottom support surface of the magazine as a loaded magazine is moved into or out of the oven or the Loader/Unloader Station.

In one embodiment, the trolley has an elevator for raising and lowering the support surface of the trolley whereby a plurality of loaded magazines can be stacked in the oven and in the Loader/Unloader Station. The trolley has alignment mechanisms such as rollers for physically engaging alignment members of the oven and the Loader/Unloader Station in horizontal alignment. Optical sensors are employed for vertical alignment of the magazines, using the trolley elevator, in the oven and Loader/Unloader Station.

In accordance with an important feature of the invention, a loaded magazine is moved to a position inside the oven with the board contacts abutting electrical connectors in the oven but not engaging the connectors. A door of the oven, when closed, has mechanisms for inserting the burn-in board contacts into the oven connectors and for extracting the contacts from the connectors. Preferably, all boards can be inserted together or separately. In one embodiment, each board has cam follower rollers at one end opposite from the contacts, and the rollers engage cam surfaces of the pneumatically actuated mechanism. When actuated, the cam surfaces engage the rollers and slidably move one or more boards in the magazine to engage the contacts or remove the contacts from the connectors.

The invention and object and features thereof will be more readily apparent from the following detailed description and appended claims when taken with the drawings.

DETAILED DESCRIPTION OF ILLUSTRATIVE EMBODIMENTS

Figure 1:
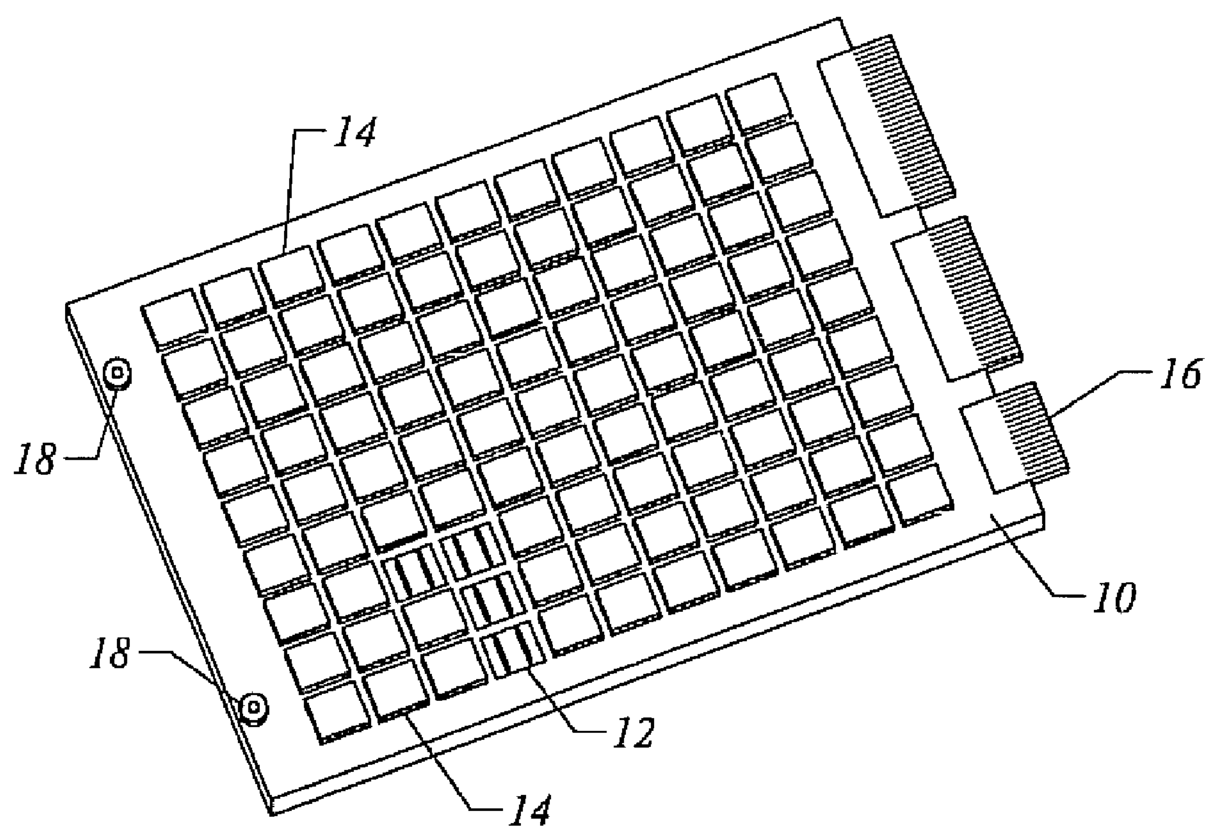
FIG. 1 is a perspective view of a burn-in board including cam-engaging rollers in accordance with one embodiment of the invention.

FIG. 1 is a perspective view of a burn-in board 10 which comprises a multi-layer printed circuit board. Mounted on one surface of board 10 and connected with the multi-layer conductive layers of the printed circuit board are sockets 12 which receive packaged integrated circuit devices 14 for burn-in testing. At one end of board 10 are conductors 16 which mate with connectors of a burn-in test apparatus for applying electrical signals to a device undergoing test. At an opposite end of board 10 are rollers 18 which as will be described are engaged by cam surfaces for the insertion and retraction of conductors 16 in and from connectors of the burn-in apparatus.

Figure 2:
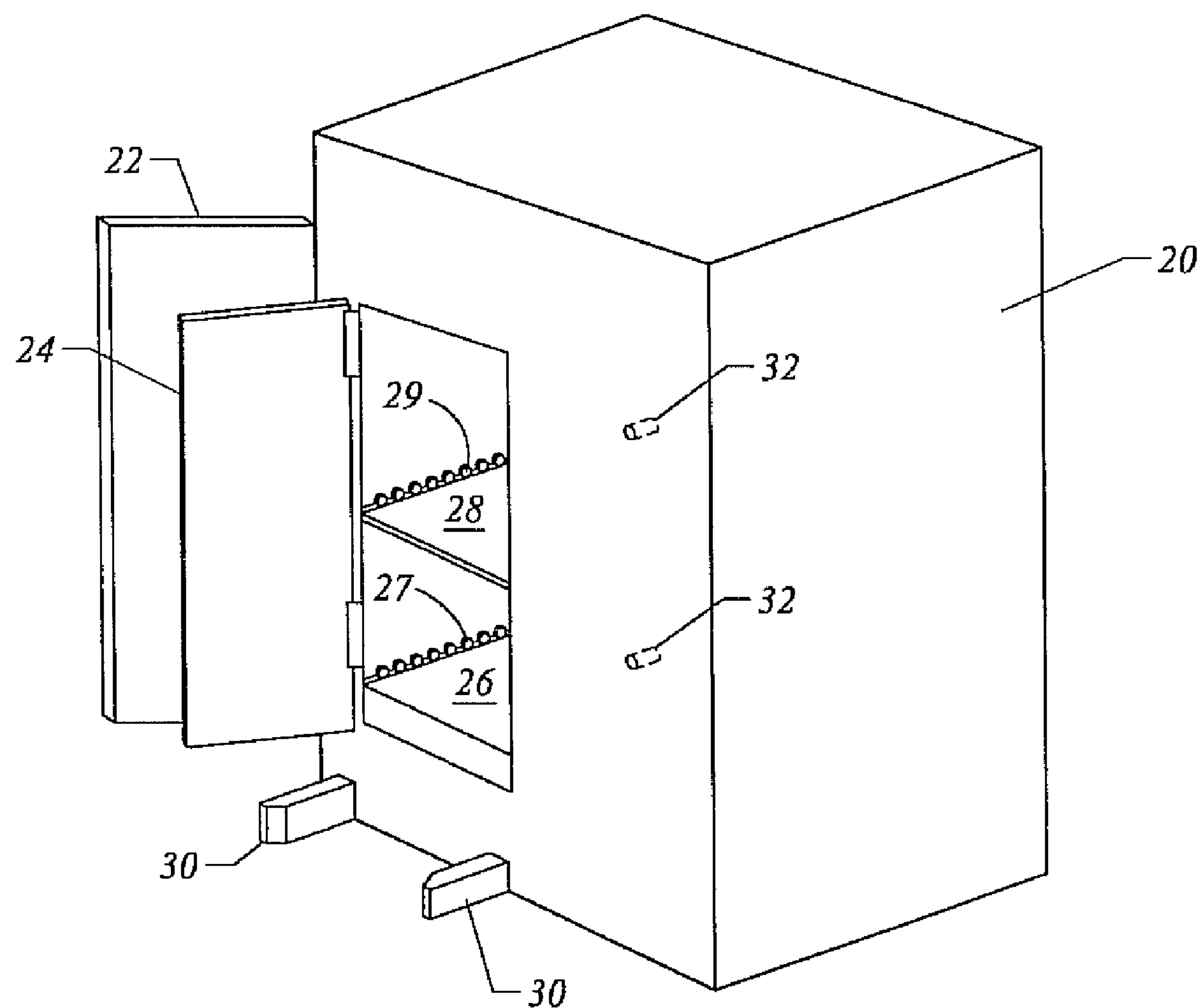
FIG. 2 is a perspective view of a burn-in oven as used in one embodiment of the invention.

FIG. 2 is a perspective view of a conventional burn-in oven such as the AEHR MTX oven which has been modified to receive a burn-in board magazine assembly in accordance with the invention. Oven 20 includes an outer door 22 which provides a heat seal during burn-in testing and an inner door 24 which inserts and retracts burn-in boards in the oven board contacts or with conductors engaging connectors during the test. A lower support surface 26 and an upper support surface 28 are provided for each receiving a magazine loaded with burn-in boards whereby the magazines can be stacked in the oven during test. Lower support surface 26 has rollers 27 and upper support surface 28 has rollers 29 for engaging the magazine assembly during loading and unloading of the magazines in the oven. Guides 30 protrude from the base of oven 20 and facilitate the horizontal alignment of a magazine with the oven for loading and unloading magazines.

Figure 3:
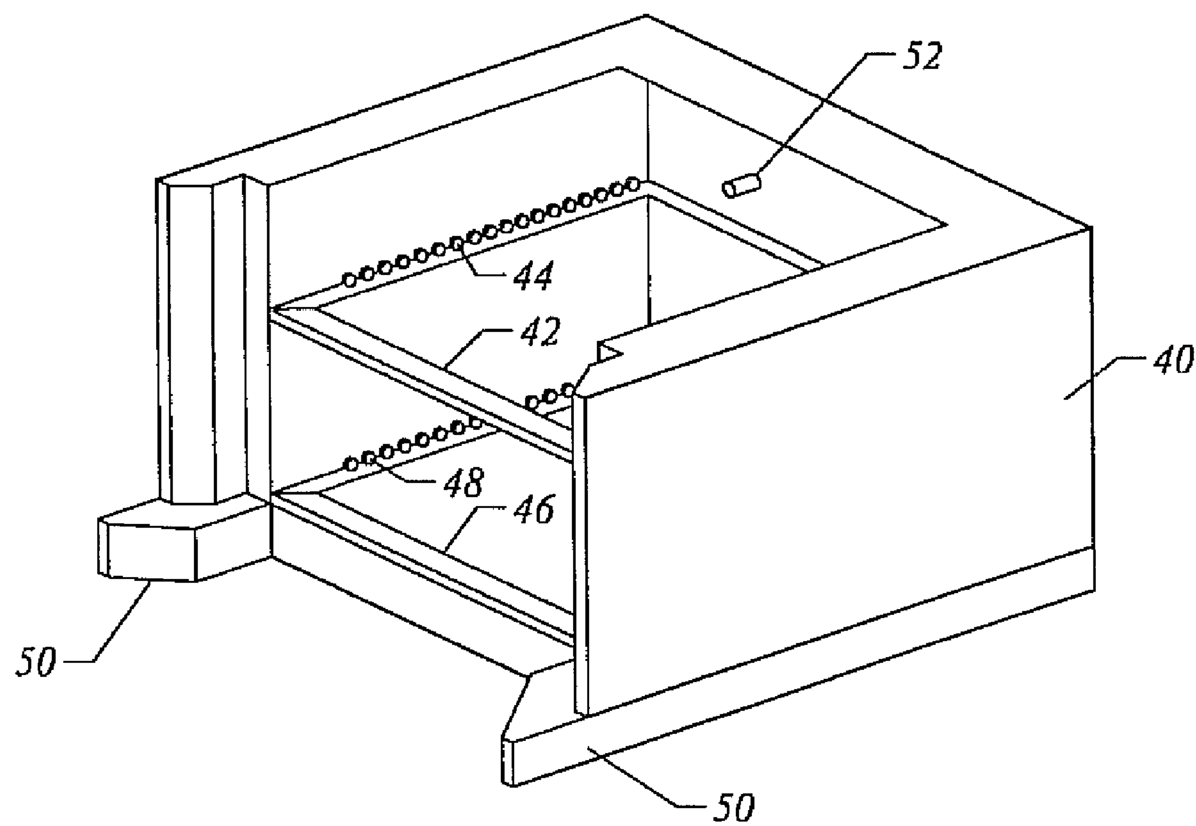
FIG. 3 is a perspective view of a Loader/Unloader Station as used in one embodiment of the invention.

FIG. 3 is a perspective view of a conventional board loader/unloader elevator station 40 which withdraws boards from a magazine for the automatic insertion and retraction of devices into burn-in boards in preparation for burn-in testing or for final unloading and packaging of acceptable devices. Station 40 includes a top support frame 42 including rollers 44 for receiving a magazine and a bottom support frame 46 including rollers 48 for receiving a magazine in a stacked arrangement. Guides 50 protrude from the loader/unloader station and provide horizontal alignment for a trolley when receiving or unloading magazines at the loader/unloader station.

Figure 4:
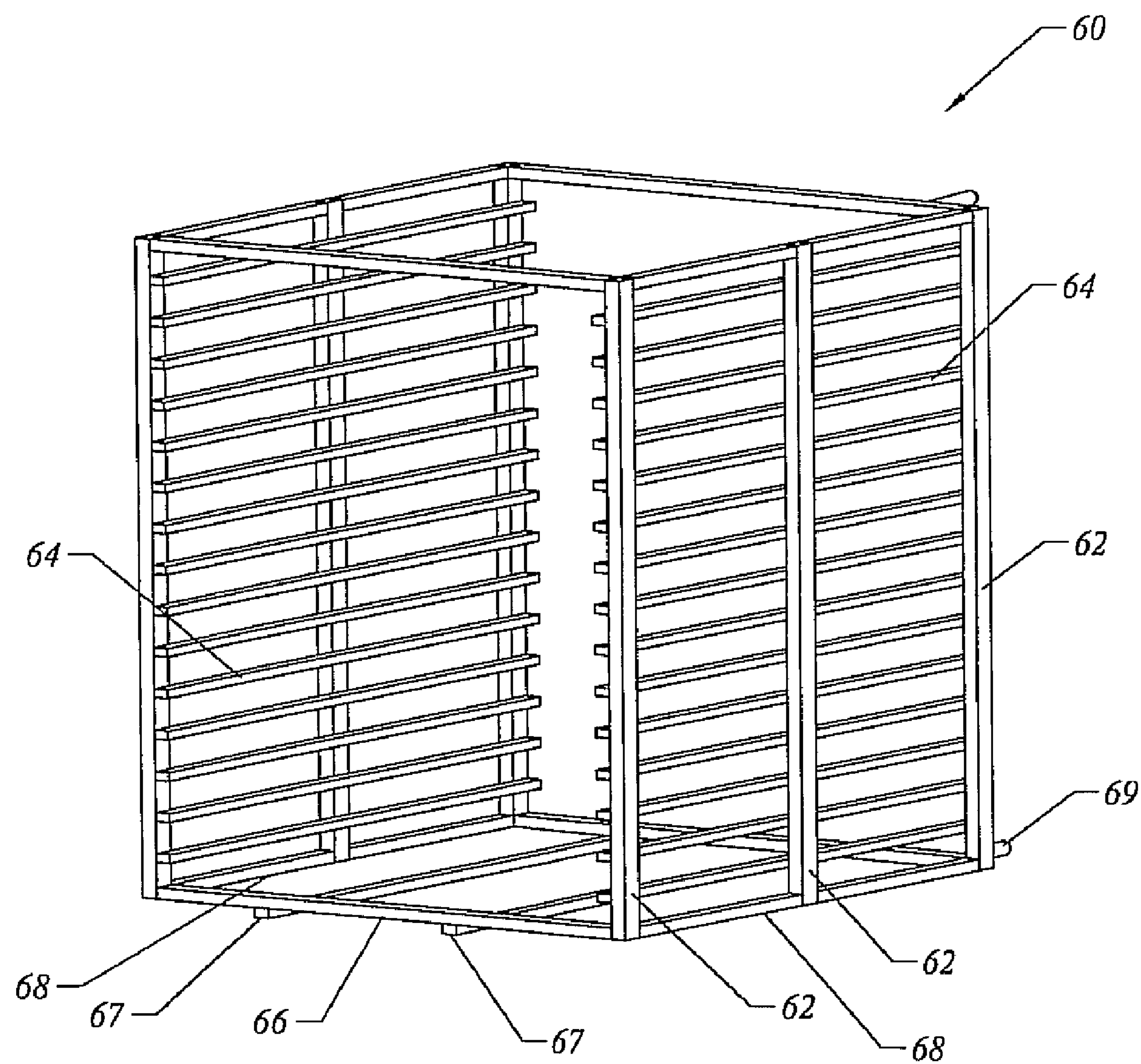
FIG. 4 is a perspective view of a magazine for supporting a plurality of burn-in boards.

FIG. 4 is a perspective view of a magazine 60 for supporting a plurality of burn-in boards in a stacked array. Magazine 60 includes a plurality of vertical support frames 62 to which are mounted board support guides 64 with opposing guides 64 slidably receiving burn-in boards in a stacked array. Rails 67, 68 on the bottom surface 66 supports the magazine when placed in the loader/unloader station or in the burn-in oven. Rails 68 on the bottom are received in an alignment guide on a trolley when loading the magazine from the oven or the loader/unloader station to the trolley for transport. In operation, unloaded burn-in boards are sequentially removed from magazine 60 when in the loader/unloader station for the automatic insertion of packaged devices into sockets of the board and automatic extraction of devices from the boards. In one embodiment, the magazine (or carrier) 60 includes an optical alignment mechanism 69 for vertically aligning the magazine with the oven 20 and the load/unload station 40.

Figure 5:
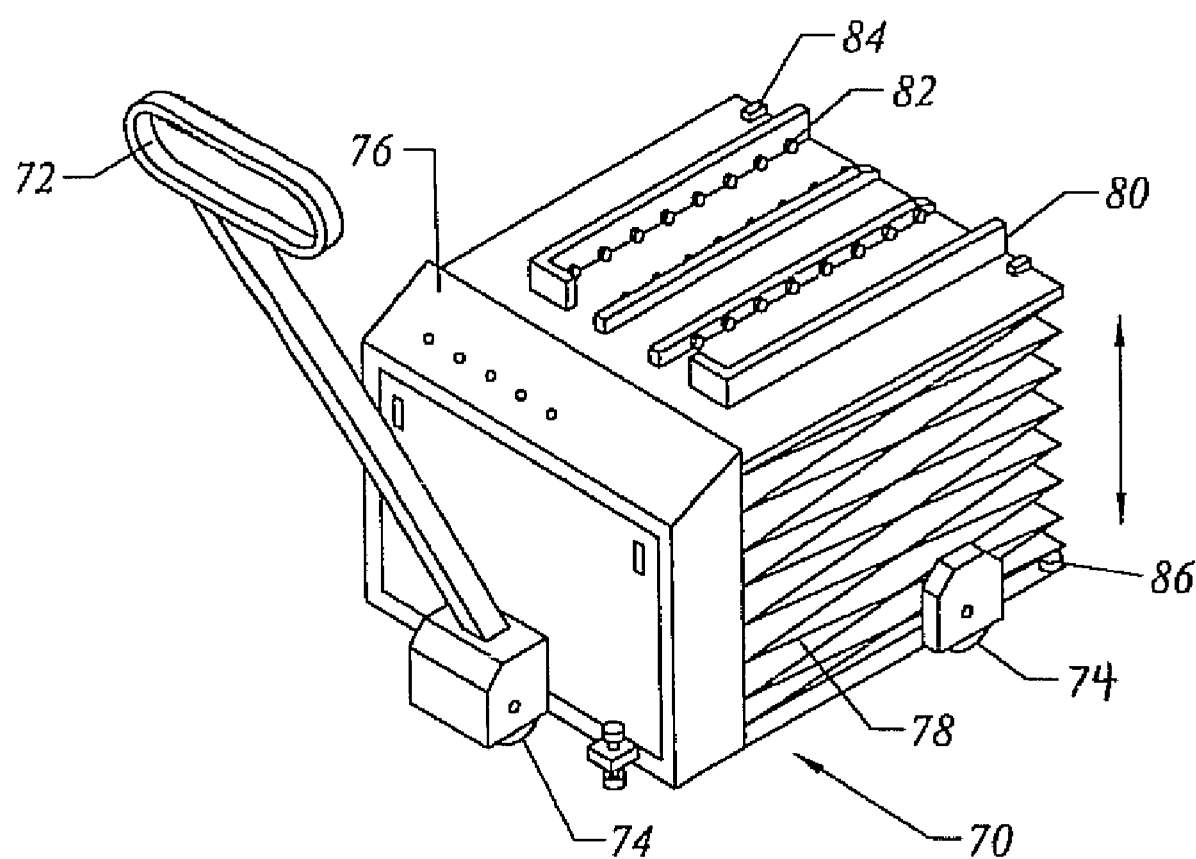
FIG. 5 is a perspective view of a trolley for use in transporting magazines.

FIG. 5 is a perspective view of a trolley for transporting burn-in boards in the magazine 60 of FIG. 4 to and from the burn-in oven of FIG. 2 and the loader/unloader station of FIG. 3. Trolley 70 includes a handle 72 for physically moving the trolley on rollers 74 between the oven and the loader/unloader station with a motor in housing 76 actuating an elevator 78 for raising and lowering the top surface for the receiving and dispensing of the stacked magazines. The top surface of the elevator includes a guide 80 for receiving rails 68 of the magazine with guide 80 having a stop portion for limiting the travel of the magazine when loaded on the elevator. Rollers 82 receive rails 68 of the magazine. An optical sensor 84 is used for vertical alignment of the elevator with the oven and the loader/unloader station, and roller guide 86 mates with physical guides 50 of the loader/unloader station and guides 30 of the oven for horizontal alignment of the trolley when loading and unloading magazines.

Figure 6:
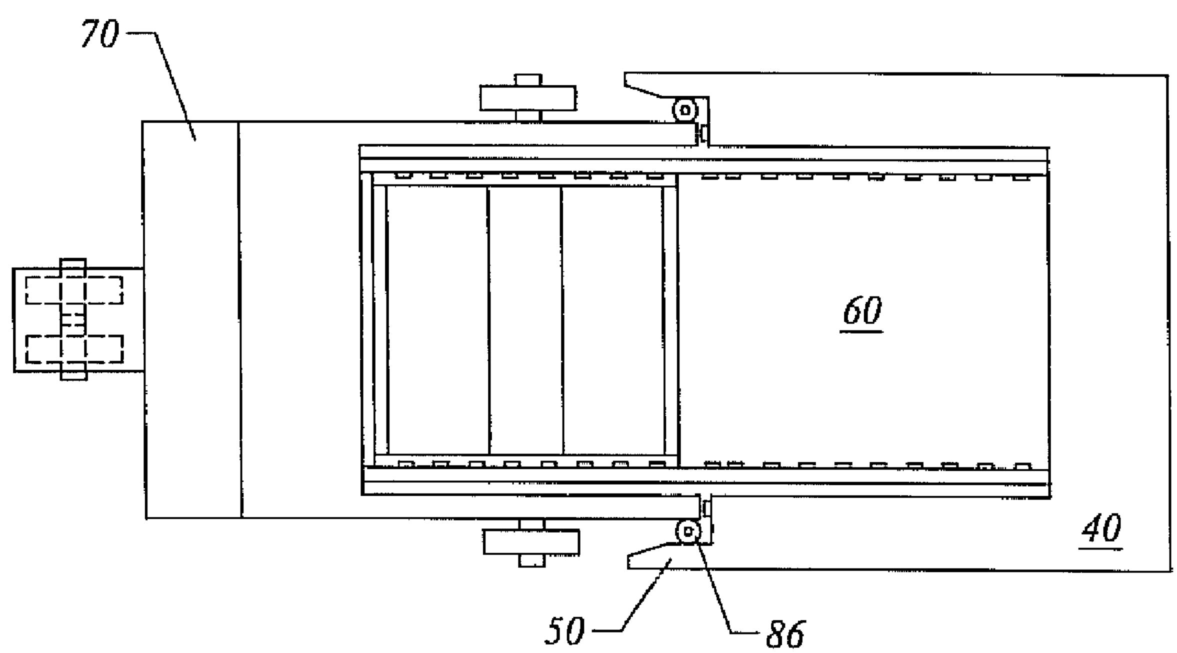
FIG. 6 is a top view illustrating a trolley receiving or unloading a magazine at a Loader/Unloader Station.

FIG. 6 illustrates trolley 70 positioned for receiving a loaded magazine 60 at the loader/unloader station 40. Roller guides 86 of trolley 70 align with guides 50 of the loader/unloader station for horizontal alignment, vertical alignment is effected by optical sensor 84 of the trolley 70 and laser 52 of the loader/unloader station (FIG. 3) and laser 32 of the oven (FIG. 2). In one embodiment, vertical alignment is effected by optical alignment mechanism 69 of the magazine 60 and laser 52 of the loader/unloader station (FIG. 3) and laser 32 of the oven (FIG. 2).

Figure 7A:
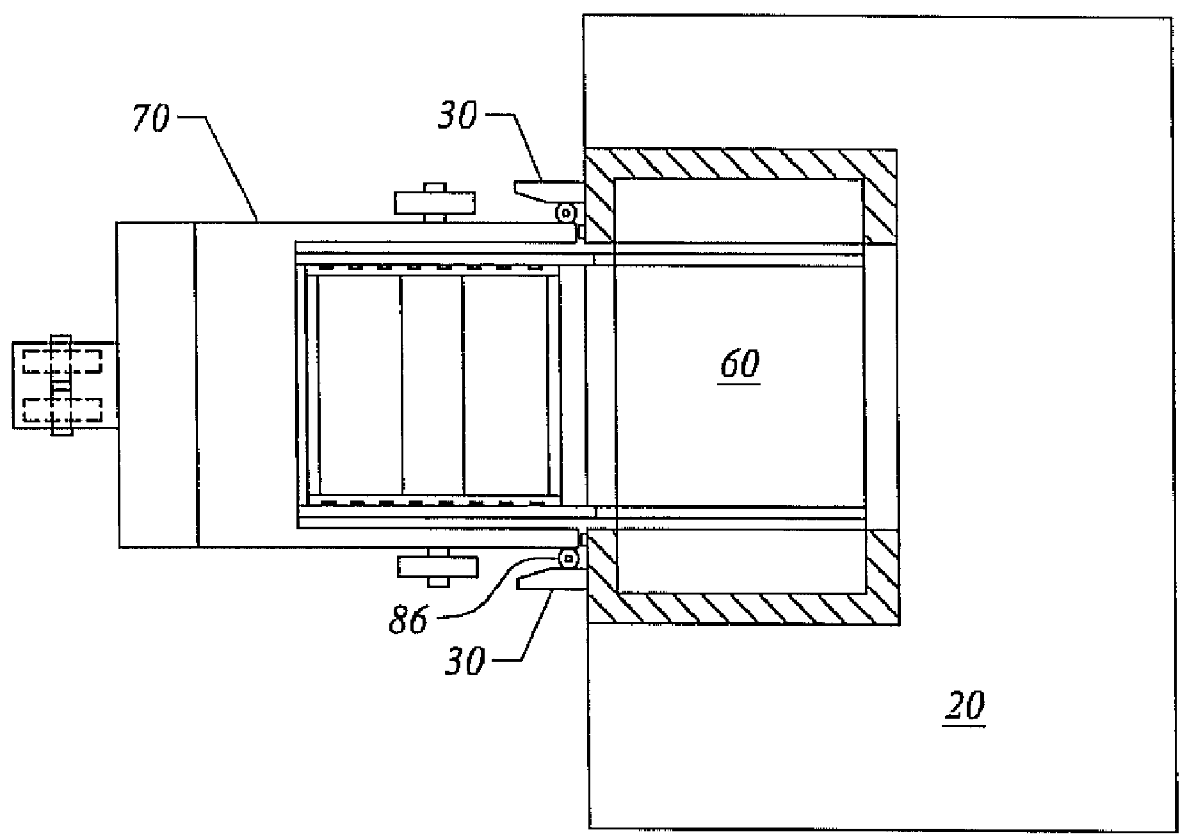
FIGS. 7*a*, 7*b* are a top view and side view of a trolley loading or unloading magazines in a burn-in oven.
Figure 7B:
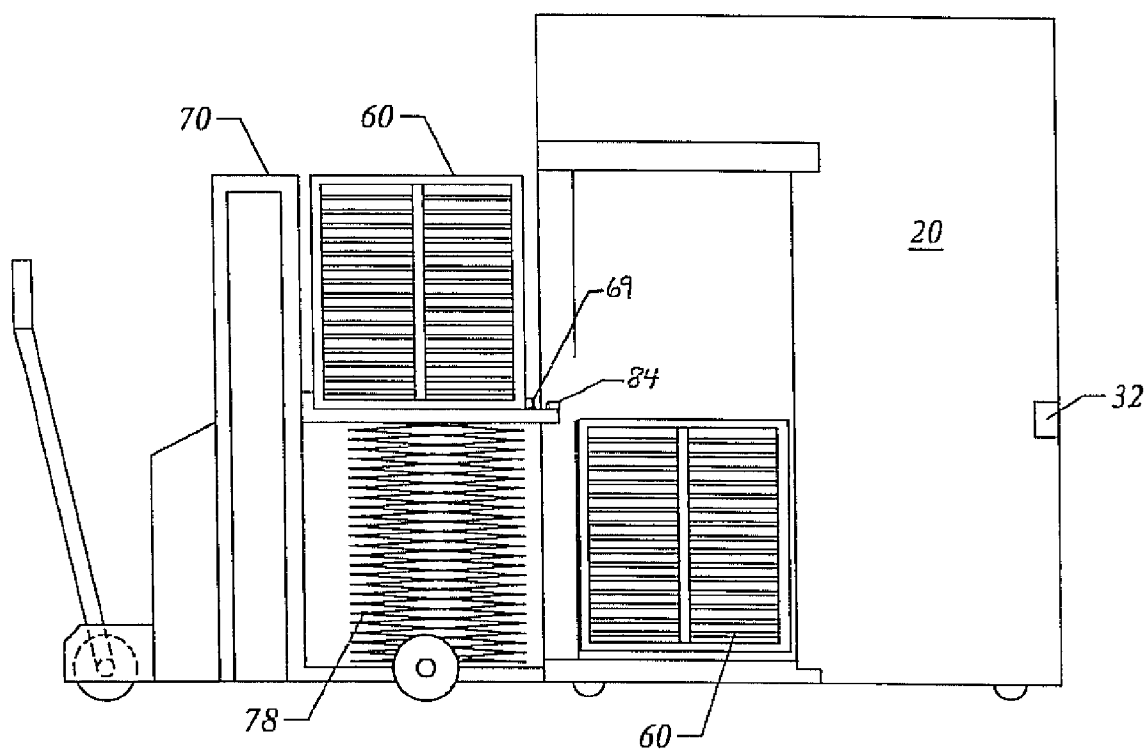

After a magazine is stacked on trolley 70 at the loader/unloader station, the trolley is physically moved to the oven as shown in FIG. 7*a* with roller guide 30 of the oven engaging roller 86 of the trolley for horizontal alignment. FIG. 7*b* is a side view illustrating the stacking of a magazine 60 on the upper shelf of oven 20. Elevator 78 raises magazine 60 until alignment sensor 84 of the trolley and alignment sensor 32 of the oven indicate vertical alignment. Thereupon magazine 60 is pushed into the oven and the trolley is removed. In one embodiment, elevator 78 raises magazine 60 until optical alignment mechanism 69 of the magazine 60 and alignment sensor 32 of the oven indicate vertical alignment.

Figure 8A:
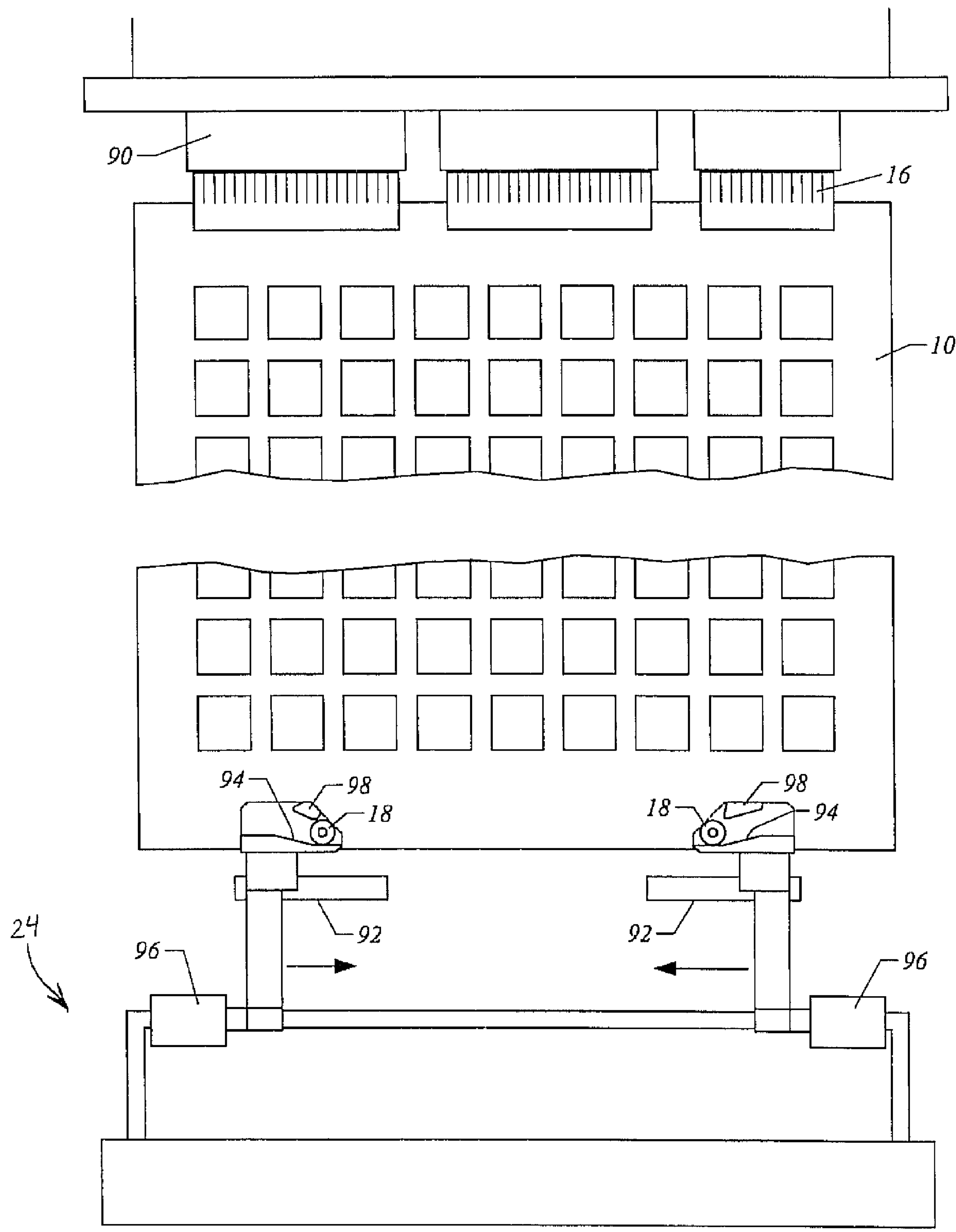
FIGS. 8*a*, 8*b* are plan views of a burn-in board in an oven with contacts of the board abutting an oven connector and with contacts inserted into the connector, respectively, and further illustrating pneumatically actuated mechanisms in the oven door for inserting the burn-in board contacts into oven connectors and for extracting the contacts from the connectors, respectively, in accordance with an embodiment of the invention.

Magazine 60 moves on rollers 29 on top shelf 28 of oven 20 (FIG. 2) until the magazine reaches a physical stop. At this position, the connectors 16 of the burn-in boards are abutting connectors in the oven, but are not inserted therein, as illustrated in FIG. 8*a*. Here the contacts 16 of board 10 are abutting connector 90, but not inserted therein. Inner door 24 of the oven is then closed with cam surfaces of pneumatic actuated locking devices, for example, shown generally at 92 engaging the rollers. Upon actuation of the pneumatically actuated devices 92, the cam surfaces urge board 10 through rollers 18 forward with the contacts 16 engaging connector 90, as shown in FIG. 8*b*.

Figure 8B:
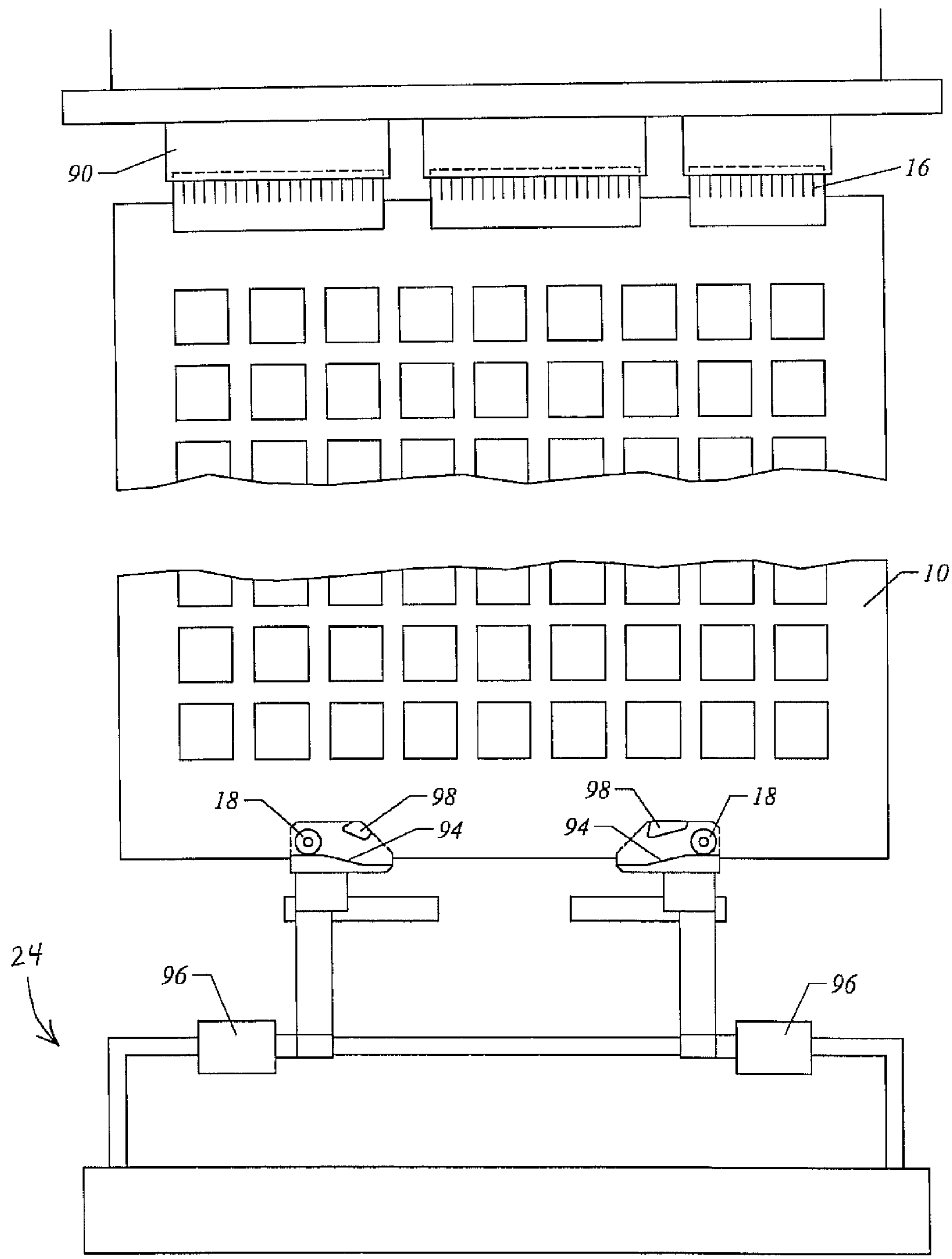

The pneumatic actuators 92 on door 24 are further illustrated in FIGS. 8*a*, 8*b*. In FIG. 8*a*, rollers 18 of board 10 engage cam surfaces 94 of the pneumatic actuators 92. Upon actuation of pneumatic cylinders 96, the cam surfaces push rollers 18 and the burn-in board 10 as indicated in FIG. 8*b*, whereupon the contacts of board 10 engage connector 90. The board contacts are removed from the connector by reverse operation of the pneumatic actuator with cam surface 98 forcing rollers 18 to travel along the cam surface 94 and back to the position in FIG. 8*a*. After the insertion of a magazine in the oven, all boards can be simultaneously moved with contacts engaging connectors or each individual board can be moved by control of the pneumatic actuators for each board.

Figure 9:
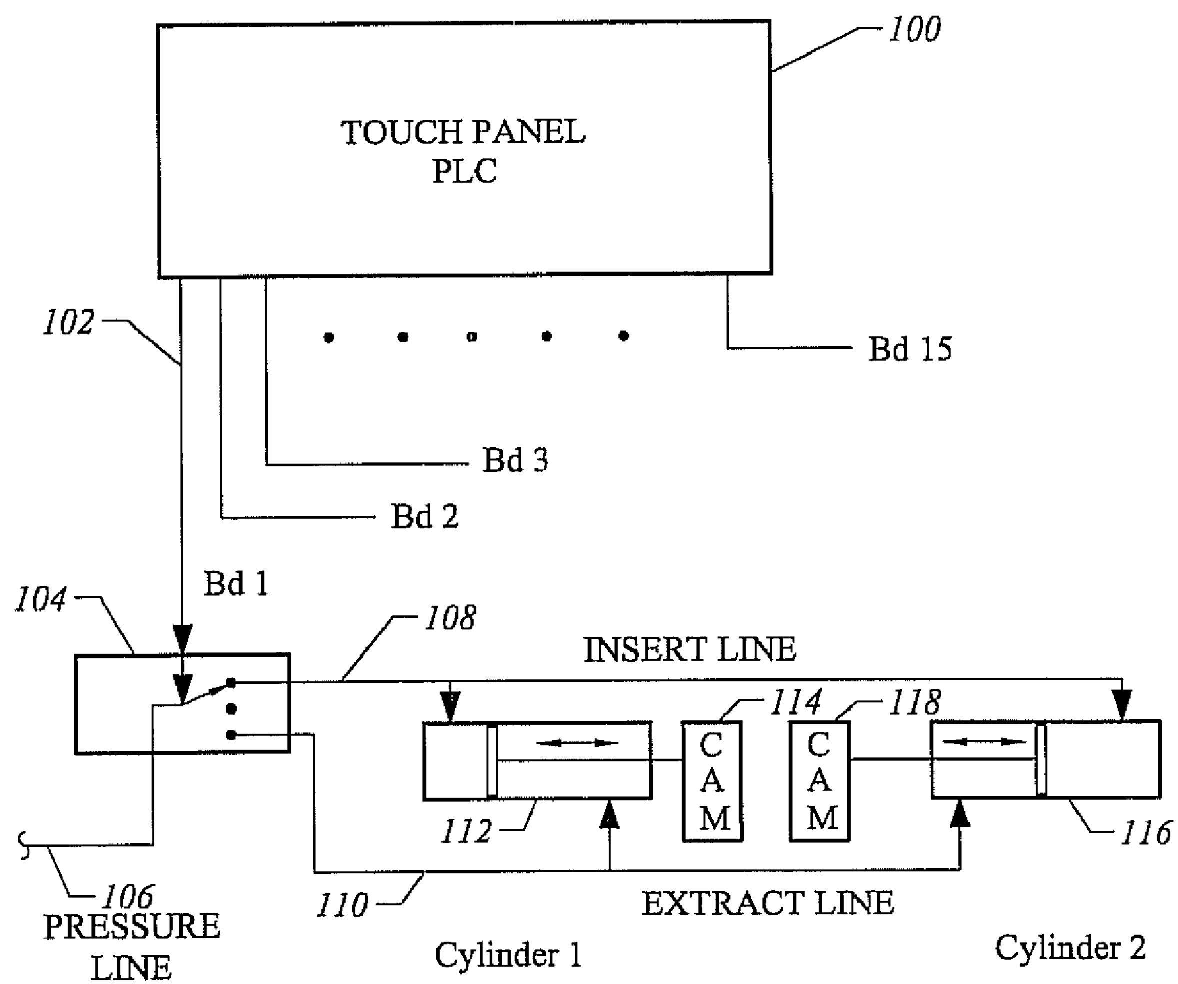
FIG. 9 is a schematic of a controller for the pneumatically actuated mechanism.

FIG. 9 is a schematic of a controller for the pneumatically actuated board insertion/retraction mechanism. A touch panel PLC 100 selects the board for insertion or retraction. Panel 100 can be a conventional and commercially available programmable logic controller such as the Pro Face tm touch screen controller. A plurality of control lines extend from the panel to control pneumatic valves and air cylinders in the insertion/extraction mechanism. For example, line 102 controls valve 104 which connects a pressure line 106 to line 108 for inserting Board No. 1 into a connector, or which connects line 106 to line 110 for extracting Board No. 1 from the connector. Air cylinder 112 drives cam 114, and air cylinder 116 drives cam 118 in slidably moving board No. 1 for connector insertion or extraction.

The invention facilitates the transfer of burn-in boards from loading/unloading stations to and from a burn-in oven with reduced physical intervention of the human operator. While the invention has been described with reference to specific embodiments, the description is illustrative of the invention and is not to be construed as limiting the invention. For example, actuators other than pneumatic can be employed in the oven door for board insertion and retraction. Various modifications and applications may occur to those skilled in the art without departing from the spirit and scope of the invention as defined by the appended claims.

What is claimed is:

1. Apparatus for burn-in testing of packaged semiconductor devices comprising:

a carrier for supporting a plurality of boards and semiconductor devices mounted thereon in a stacked array;

a Load/Unload Station for inserting packaged semiconductor devices sequentially into boards placed in the carrier;

an oven for receiving a carrier with stacked boards and performing burn-in tests, the oven including electrical connectors for engaging boards for electrical testing, and a mechanism for engaging the boards and sliding the boards into engagement with connector of the oven; and a trolley for abutting the Load/Unload Station and receiving a carrier with stacked boards and abutting the oven for delivering the carrier and stacked boards, the trolley has an elevator for placing a plurality of carriers in a stack in the oven, the trolley includes a physical alignment mechanism for use in horizontally aligning the trolley with a Load/Unload Station and an oven, and the carrier includes an optical alignment mechanism for use in vertically aligning the carrier with the oven and the Load/Unload Station.

2. Apparatus of claim 1 wherein the mechanism is pneumatically actuated.

3. Apparatus of claim 1 wherein the trolley, the oven, and the Load/Unload Station have rollers to facilitate the movement of a carrier with stacked boards.

4. Apparatus of claim 3 wherein the trolley has the elevator for placing a plurality of carriers in a stack in the Load/Unload Station.

5. Apparatus of claim 4 wherein the physical alignment mechanism is for horizontal alignment of the carrier with the oven and with the Load/Unload Station.

6. Apparatus of claim 5 wherein the mechanism is pneumatically actuated and the oven includes a door including the pneumatically actuated mechanism which when closed engages and slides boards and contacts on one end of the boards into engagement with the electrical connectors in the oven.

7. Apparatus of claim 3 wherein each board includes a plurality of rollers at one end of the board opposite from the electrical contacts at another end of the board, the mechanism including cam surfaces which receive the plurality of rollers and drive the boards through the rollers when the cam surfaces are slid on the rollers by pneumatic actuation.

8. Apparatus for burn-in testing of packaged semiconductor devices comprising:

a carrier for supporting a plurality of boards and semiconductor devices mounted thereon in a stacked array;

a Load/Unload Station for inserting packaged semiconductor devices sequentially into boards placed in the carrier;

an oven for receiving a carrier with stacked boards and performing burn-in tests, the oven including electrical connectors for engaging boards for electrical testing, and a mechanism for engaging the boards and sliding the boards into engagement with connector of the oven; and a trolley for abutting the Load/Unload Station and receiving a carrier with stacked boards and abutting the oven for delivering the carrier and stacked boards;

wherein the trolley, the oven, and the Load/Unload Station have rollers to facilitate the movement of a carrier with stacked boards, wherein each board includes a plurality of rollers at one end of the board opposite from the electrical contacts at another end of the board, the mechanism including cam surfaces which receive the plurality of rollers and drive the boards through the rollers when the cam surfaces are slid on the rollers by pneumatic actuation.

9. Apparatus of claim 8 wherein the trolley has an elevator for placing a plurality of carriers in a stack in the Load/Unload Station and in the oven.

10. Apparatus of claim 9 wherein the trolley includes a physical alignment mechanism for horizontal alignment of the carrier with the oven and with the Load/Unload Station, and the carrier includes an optical alignment mechanism for vertically aligning the carrier with the oven and the Load/Unload Station.

11. Apparatus of claim 10 wherein the oven includes a door including the pneumatically actuated mechanism which when closed engages and slides boards and contacts on one end of the boards into engagement with the electrical connectors in the oven.

12. Apparatus of claim 8 wherein the trolley has an elevator for placing a plurality of carriers in a stack in the oven.

13. Apparatus of claim 12 wherein the trolley includes a physical alignment mechanism for use in horizontally aligning the trolley with a Load/Unload Station and an oven, and the carrier includes an optical alignment mechanism for use in vertically aligning the carrier with the oven and the Load/Unload Station.

14. Apparatus for burn-in testing of packaged semiconductor devices comprising:

a carrier for supporting a plurality of boards and semiconductor devices mounted thereon in a stacked array;

a Load/Unload Station for inserting packaged semiconductor devices sequentially into boards placed in the carrier;

an oven for receiving a carrier with stacked boards and performing burn-in tests, the oven including electrical connectors for engaging boards for electrical testing, and a mechanism for engaging the boards and sliding the boards into engagement with connector of the oven; and a trolley for abutting the Load/Unload Station and receiving a carrier with stacked boards and abutting the oven for delivering the carrier and stacked boards;

wherein the trolley, the oven, and the Load/Unload Station have rollers to facilitate the movement of a carrier with stacked boards, wherein the trolley has an elevator for placing a plurality of carriers in a stack in the Load/Unload Station and in the oven, wherein the trolley includes a physical alignment mechanism for horizontal alignment of the carrier with the oven and with the Load/Unload Station, and the carrier includes an optical alignment mechanism for vertically aligning the carrier with the oven and the Load/Unload Station.

15. Apparatus of claim 14 wherein the mechanism is pneumatically actuated.

16. Apparatus of claim 14 wherein the mechanism is pneumatically actuated and the oven includes a door including the pneumatically actuated mechanism which when closed engages and slides boards and contacts on one end of the boards into engagement with the electrical connectors in the oven.

17. Apparatus of claim 14 wherein each board includes a plurality of rollers at one end of the board opposite from the electrical contacts at another end of the board, the mechanism including cam surfaces which receive the plurality of rollers and drive the boards through the rollers when the cam surfaces are slid on the rollers by pneumatic actuation.

18. Apparatus of claim 14 wherein the physical alignment mechanism is for use in horizontally aligning the trolley with a Load/Unload Station and an oven.

* * * * *